US007204999B2

(12) United States Patent
Okuda et al.

(10) Patent No.: US 7,204,999 B2
(45) Date of Patent: Apr. 17, 2007

(54) METHOD OF PRODUCTION OF NANOPARTICLE AND NANOPARTICLE PRODUCED BY THE METHOD OF PRODUCTION

(75) Inventors: Mitsuhiro Okuda, Higashiosaka (JP); Hideyuki Yoshimura, Kawasaki (JP); Ichiro Yamashita, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/702,459

(22) Filed: Nov. 7, 2003

(65) Prior Publication Data

US 2004/0197884 A1 Oct. 7, 2004

Related U.S. Application Data

(63) Continuation of application No. PCT/JP03/11810, filed on Sep. 17, 2003.

(30) Foreign Application Priority Data

Sep. 20, 2002 (JP) ............................. 2002-275598
Apr. 9, 2003 (JP) ............................. 2003-105676

(51) Int. Cl.
*A61K 9/50* (2006.01)

(52) U.S. Cl. ...................... 424/499; 424/400; 424/489; 514/2; 435/375

(58) Field of Classification Search ................ 424/489, 424/488
See application file for complete search history.

(56) References Cited

U.S. PATENT DOCUMENTS 4,458,584 A * 7/1984 Annese et al. ............. 99/323.1
5,304,382 A * 4/1994 Monzyk ..................... 424/489
5,358,722 A * 10/1994 Monzyk ..................... 424/489
5,690,903 A * 11/1997 Hainfeld .................... 424/1.49
5,992,700 A * 11/1999 McGlothlin et al. ........ 222/187
6,121,075 A 9/2000 Yamashita
2002/0009410 A1* 1/2002 Mathur ....................... 423/430
2002/0119093 A1 8/2002 Murayama et al.

FOREIGN PATENT DOCUMENTS

EP 0881691 A2 12/1998
JP 2001-504277 * 3/2001
JP 2001-504277 A 3/2001
JP 2001-181842 A 7/2001
WO WO 98/22942 A1 5/1998
WO WO9822942 * 5/1998
WO WO 01/68513 A 9/2001

OTHER PUBLICATIONS

Okuda et al, "Fabrication of Nickel and ChromiumNanoparticles Using the Protein Cage of Apoferritin,"(2003), 84(2), pp. 187-194.*
Creighton, Thomas E., "Proteins," 1996, W.H. Freeman and Company, Forth Printing, pp. 361-363 and 261-268.*
Okuda M. et al., "Fabrication of nickel and chromium nanoparticles using the protein cage of apoferritin", Biotechnology and Bioengineering, vol. 84, No. 2, pp. 187 to 194, Aug. 1, 2003.
Price, Daniel J et al: "Ferritin, Binding of Beryllium and other divalent metal ions," Journal of Biological Chemistry, vol. 258, No. 18, Sep. 25, 1983, pp. 10873-10880.

* cited by examiner

*Primary Examiner*—Michael P. Woodward
*Assistant Examiner*—Eric E. Silverman
(74) *Attorney, Agent, or Firm*—McDermott Will & Emery LLP

(57) ABSTRACT

The method of the production of a nanoparticle of the present invention includes a step of forming a nanoparticle including a compound of ametal ion in a cavity part of aprotein, in a solution containing the protein having the cavity part therein, the metal ion, and a carbonate ion and/or a hydrogen carbonate ion. Examples of the aforementioned compound include e.g., a hydroxide. The aforementioned metal ion is preferably any one of a nickel ion ($Ni^{2+}$), a chromium ion ($Cr^{2+}$) or a copper ion ($Cu^{2+}$). According to the aforementioned method, nanoparticles having a uniform particle diameter can be produced.

9 Claims, 11 Drawing Sheets

4 3 1

(a)

(b)

(c)

(d)

(e)

METHOD OF PRODUCTION OF NANOPARTICLE AND NANOPARTICLE PRODUCED BY THE METHOD OF PRODUCTION

This is a continuation application under 35 U.S.C. 111(a) of pending prior International Application No. PCT/JP03/11810, filed on Sep. 17, 2003.

BACKGROUND OF THE INVENTION

1. Field of the Invention

The present invention relates to a method of the production of a nanoparticle in which a cavity of a protein is utilized, a nanoparticle produced by the method of the production, and a nanoparticle-protein complex generated in the production step of the method of the production.

2. Description of the Related Art

Mainstream of the development of functional materials implemented so far involves exploration and synthesis of novel compounds which allow performing a desired function. However, in recent years, it has been desired to allow performing new functions which can not be achieved in a bulk state through producing nanoparticles obtained by fine division of a substance into a nanometer size. In particular, production of nanoparticles of semiconductors or inorganic materials including a metal compound as a center has been strongly desired for the purpose of producing quantum effect devices which draw the attention in recent years.

Methods of the production of nanoparticles which have been conventionally carried out involve physical grinding methods, chemical synthesis methods and the like. For example, the physical grinding methods have been widely used in order to obtain starting materials upon baking of ceramics. In addition, examples of the chemical synthesis method include methods in which gold nanoparticles are produced through reducing chloroauric acid among long chain organic compounds. The long chain organic compound in this process inhibits the growing of a gold particle to an enormous size.

Furthermore, there exist methods in which a complex between an organic compound and a nanoparticle is generated followed by a chemical reaction to result in uniform particles. As an application of this method, there also exists a method in which gold nanoparticles are obtained having a self-assembled monomolecular membrane (SAM membrane) formed on their surfaces through fixing a gold atom on a material for forming a SAM membrane, and assembling the material such that the gold atom becomes the center. Moreover, a method is also executed in which a micelle including a material which forms a nanoparticle is produced, and nanoparticles are produced using a chemical reaction in the micelle.

In order to produce a quantum effect device, it is essential to obtain nanoparticles having the identical diameter. Energy level which can be attained by an electron in a nanoparticle greatly varies depending upon the diameter in the order of several nanometers. Hence, to give a constant diameter is important in applying nanoparticles having a quantum effect to an electronic circuit.

However, it is difficult to obtain nanoparticles having a uniform diameter by the conventional methods as described above. In the physical grinding method, for example, it is originally difficult to make the particle diameter smaller than the micron size, and even though the size could approximate the order of nanometer, no mechanism has been established to accomplish a constant diameter. Hence, great spread of the diameter of thus resulting nanoparticles is inevitably generated. In addition, in the chemical synthesis method, the great spread of the diameter of the resulting nanoparticles is also generated inevitably because a chemical reaction is utilized therein. Further, it is also disadvantageous in respect of the required time period and cost.

On the other hand, in an attempt to apply biotechnology to other filed, there exist investigations in which nanoparticles having uniform size in the order of nano are intended to be produced through rendering the incorporation of a metal or a metal compound into apoferritin that is a protein having a function to hold a metal compound. Investigations have been carried out so that any of various kinds of metals or metal compounds is introduced into apoferritin in compliance with the use of the nanoparticle.

Apoferritin is now explained below. Apoferritin is a protein which is present widespread in an animate nature, and plays a role to regulate the amount of iron which is an essential trace element in a living body. A complex of iron or an iron compound with apoferritin is referred to as ferritin. Since iron is deleterious to a living body when it is present in an excessive amount in the body, excess iron is stored in the body in the form of ferritin. Furthermore, ferritin returns to apoferritin through releasing an iron ion as needed.

FIG. 1 is a schematic view illustrating the structure of apoferritin. As shown in FIG. 1, apoferritin 1 is a spherical protein having the molecular weight of about 460,000 with 24 monomer subunits, which are formed from a single polypeptide chain, being assembled via noncovalent bonds, having the diameter of about 12 nm, and exhibits higher thermostability and pH stability in comparison with general proteins. There is a cavity-like holding part 4 having the diameter of about 6 nm in the center of apoferritin 1, and the outside and the holding part 4 are connected via a channel 3. For example, when a bivalent iron ion is incorporated into apoferritin 1, the iron ion enters from the channel 3, and reaches to the holding part 4 after being oxidized in a place which is present within a part of the subunits and is referred to as a ferrooxidase center (iron oxidation active center). The iron ion is thereafter concentrated in a negative charge region on the inner surface of the holding part 4. Then, the iron atoms assemble by 3000 to 4000, and held in the holding part 4 in the form of a ferrihalide ($5Fe_2O_3.9H_2O$) crystal. Diameter of the nanoparticle, which was held in the holding part 4, comprising the metal atom is nearly equal to the diameter of the holding part 4, which is about 6 nm.

Using this apoferritin, nanoparticle-apoferritin complexes have been generated in which a metal or a metal compound other than iron is artificially carried.

Introduction of a metal or a metal compound such as manganese (see, P. Mackle, 1993, J. Amer. Chem. Soc. 115, pp. 8471–8472; and F. C. Meldrum et al., 1995, J. Inorg. Biochem. 58, pp. 59–68), uranium (see, J. F. Hainfeld, 1992, Proc. Natl. Acad. Sci. USA, 89, pp. 11064–11068), beryllium (see, D. J. Price, 1983, J. Biol. Chem. 258, pp. 10873–10880), aluminum (see, J. Fleming, 1987, Proc. Natl. Acad. Sci. USA, 84, pp. 7866–7870), and zinc (D. Price and J. G. Joshi, Proc. Natl. Acad. Sci. USA, 1982, 79, pp. 3116–3119) into apoferritin has been reported so far. The diameter of the nanoparticles including any one of these metals or metal compounds is also nearly equal to the diameter of the holding part 4 of apoferritin, which is about 6 nm.

Summary of the process in which nanoparticles including an iron atom are formed in apoferritin in the natural world is as follows.

On the surface of the channel 3 which connects between the outside and inside of apoferritin 1 (see, FIG. 1) are exposed amino acids having a negative charge under a condition of pH of 7–8, thus iron (II) ions having a positive charge are incorporated into the channel 3 by an electrostatic interaction. On the inner surface of the holding part 4 of apoferritin 1 are exposed a lot of glutamic acid residues which are amino acid residues having a negative charge at pH 7–8, similarly to the inner surface of the channel 3, and the iron (II) ions incorporated from the channel 3 are oxidized at the ferroxidase center, followed by introduction to the internal holding part 4. Then, the iron ions are concentrated by an electrostatic interaction, and the core formation of a ferrihalide ($5Fe_2O_3.9H_2O$) crystal is caused.

Thereafter, a core which comprises iron oxide is grown through adherence of the iron ions, which are sequentially incorporated, to the crystal core, and accordingly, a nanoparticle having the particle diameter of 6 nm is formed in the holding part 4. Summary of the formation of a nanoparticle including iron oxide as well as the incorporation of the iron ions is as set forth above.

Although a mechanism of the incorporation of iron ions into apoferritin was described hereinabove, it is believed that other metal ions, which were reported hitherto as candidates for the introduction, also involve an approximately similar mechanism to that for the iron ion. However, metal ions which can be incorporated in the cavity part by the method described above were limited to particular ones.

SUMMARY OF THE INVENTION

An object of the present invention is to provide a method of the production a nanoparticle in which a cavity of a protein is utilized, which enables to obtain also nanoparticles having a uniform particle diameter including a metal ion such as nickel ion ($Ni^{2+}$), chromium ion ($Cr^{2+}$), copper ion ($Cu^{2+}$) or the like which has not been hitherto reported on the formation of a nanoparticle in a cavity part of a protein.

The present invention is directed to a method of the production of a nanoparticle which comprises a step of forming a nanoparticle, which includes compound of a metal ion in a cavity part of a protein, in a solution containing the protein having the cavity part therein, the metal ion, and a carbonate ion and/or a hydrogen carbonate ion.

Examples of the aforementioned compound include e.g., a hydroxide.

The aforementioned metal ion is preferably any one of a nickel ion ($Ni^{2+}$), a chromium ion ($Cr^{2+}$) or a copper ion ($Cu^{2+}$).

The pH of the aforementioned solution is preferably approximately equal to a precipitation point of a hydroxide of the aforementioned metal ion.

When a nickel ion is used as the aforementioned metal ion, the pH of the aforementioned solution is preferably 8 or greater and 9 or less.

In addition, when a nickel ion is used as the aforementioned metal ion, the aforementioned solution preferably includes an ammonium ion, and in this instance, the pH of the aforementioned solution is preferably greater than 8.3 and equal to or less than 8.65.

For example, the aforementioned protein is at least one of apoferritin, Dps protein, CCMV protein, TMV protein or a heat shock protein.

For example, the aforementioned solution contains a carbonate ion and/or a hydrogen carbonate ion produced by bubbling carbon dioxide thereto.

After forming the aforementioned nanoparticle, the method may further comprise a step of eliminating the protein by a heat treatment.

In addition, the present invention concerns a nanoparticle including a compound of a metal ion, which is formed in a cavity part of a protein, in a solution containing the protein having the cavity part therein, the metal ion, and a carbonate ion and/or a hydrogen carbonate ion.

Moreover, the present invention concerns a complex comprising a protein having a cavity part therein, and a nanoparticle formed in the cavity part of the protein; the nanoparticle being a nanoparticle including a compound of a metal ion, which is formed in the cavity part of the protein, in a solution containing the protein, the metal ion, and a carbonate ion and/or a hydrogen carbonate ion.

These objects as well as other objects, features and advantages of the invention will become apparent to those skilled in the art from the following description with reference to the accompanying drawings.

DESCRIPTION OF THE PREFERRED EMBODIMENTS

Embodiments of the present invention are explained below with reference to accompanying drawings.

Embodiment 1

Figure 1:
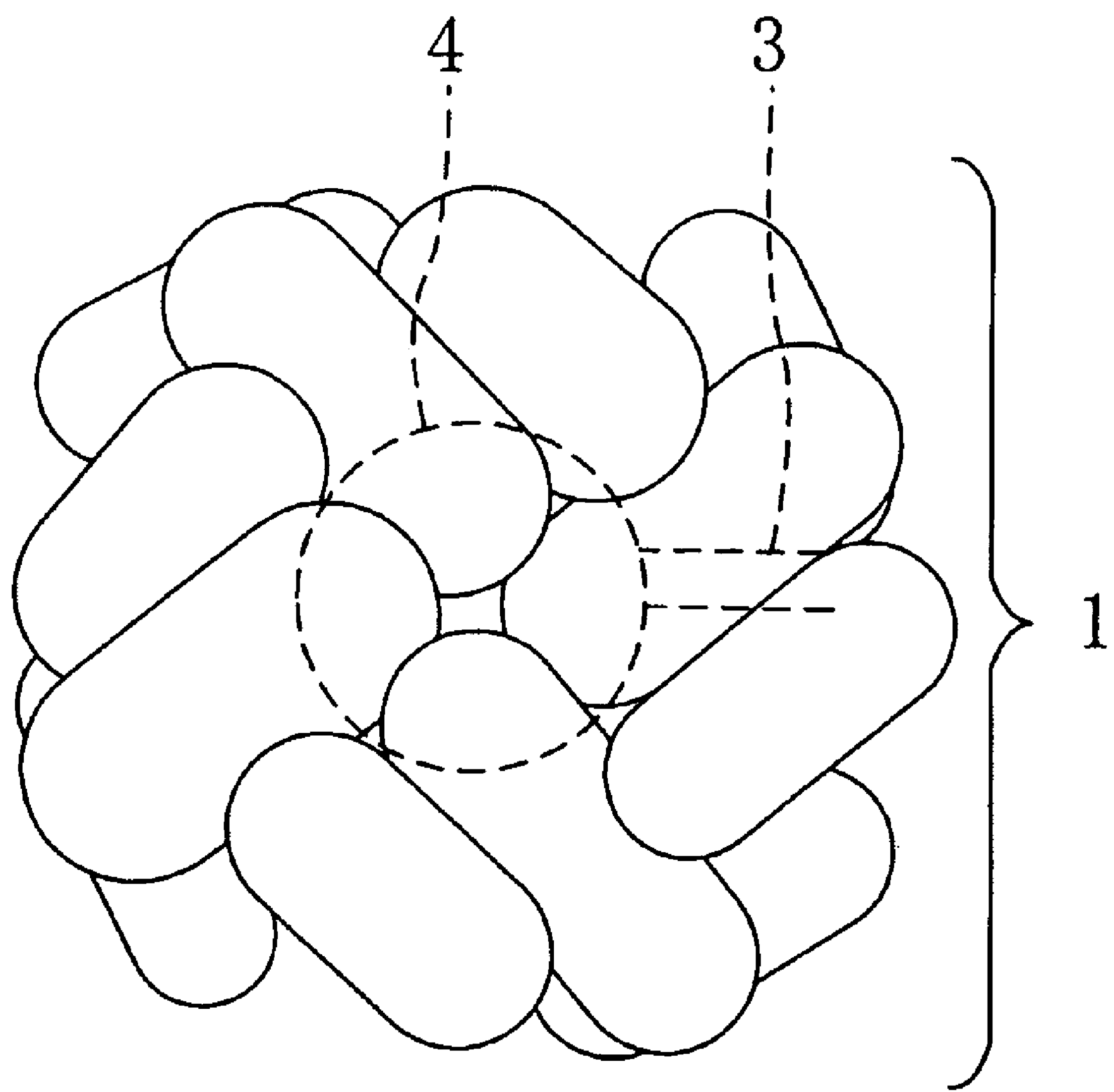
FIG. 1 is a schematic view illustrating the structure of apoferritin.

The method of the production of a nanoparticle according to this embodiment is explained with reference to FIG. 1 and FIG. 2.

Figure 2:
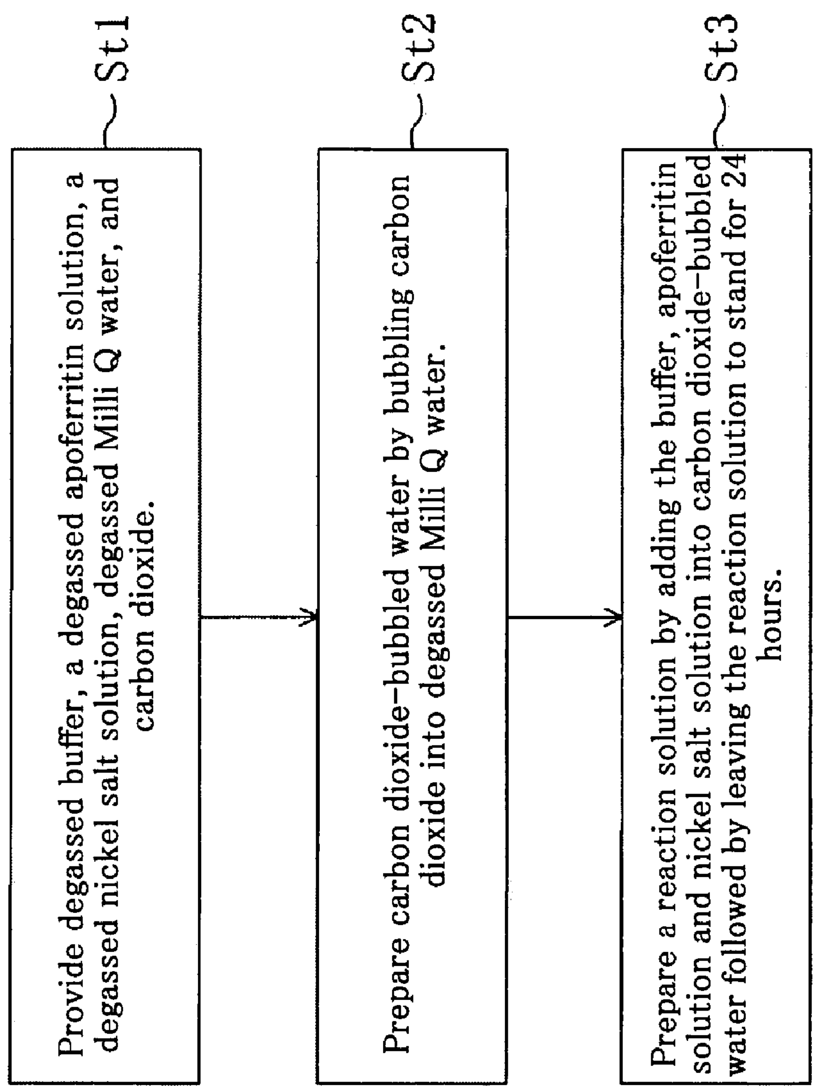
FIG. 2 is a flow chart illustrating a method of the production of a nickel compound-apoferritin complex of Embodiment 1.

FIG. 2 is a flow chart illustrating a method of the production of a complex comprising a protein including a nanoparticle of a nickel compound therein of this embodiment (hereinafter, may be also referred to as "nickel compound-apoferritin complex")

First, as shown in FIG. 2, in the step St1, a buffer including a mixed solution of HEPES and CAPSO, an apoferritin solution, a nickel salt solution, Milli Q water, and carbon dioxide are provided. The buffer, apoferritin solution, nickel salt solution and Milli Q water provided for use in this step should be degassed.

Next, in the step St2, carbon dioxide-bubbled water is prepared by bubbling carbon dioxide in degassed Milli Q water.

Next, in the step St3, a reaction solution is prepared by adding the buffer, apoferritin solution and nickel salt solution to the carbon dioxide-bubbled water obtained in the aforementioned step St2. Thereafter, the reaction solution is left to stand for 24 hours.

The operations for producing the nickel compound-apoferritin complex explained hereinabove are all conducted at room temperature, or in the range of the temperature which does not result in denaturation of apoferritin, while stirring with a stirrer.

By the aforementioned operations, the compound of a nickel ion ($Ni^{2+}$) is introduced into a holding part 4 of apoferritin 1 to form a nickel compound-apoferritin complex.

Proteins including apoferritin are produced on the basis of information of a DNA, and are readily reproduced in a large number by any known method. Further, it is well known that proteins reproduced from the identical DNA in a large number have the same structure in an accuracy of the angstrom level. Therefore, the cavity like holding parts 4 carried by apoferritin used in this embodiment all have the same size and shape.

Therefore, when nanoparticles are produced in proteins as in this embodiment, the diameter of the nanoparticle is defined by the protein to result in nanoparticles having a uniform particle diameter. For example, in accordance with this embodiment, the diameter of the nanoparticle becomes 6 nm which is almost the same as the diameter of the holding part of apoferritin.

Although apoferritin was used as a protein in this embodiment, any protein constituted from a single subunit or any protein constituted from multiple subunits may be used instead of apoferritin as long as the protein has a cavity part. Further, the protein is not limited to one with a cavity part having a spherical form, but may be any one with a cavity part having a rod shape, a ring shape or the like. For example, Dps protein, viral protein, a heat shock protein or the like may be used. When Dps protein (a spherical shell-like protein having the diameter of 9 nm, and having a holding part therein with the diameter of 4 nm) is used, nanoparticles having the diameter of 4 nm can be produced. Examples of the viral protein include for example, CPMV, CCMV, HSV, Rotavirus, Reovirus, LA-1, Polyoma, CaMV, HPV, Ross River, SpV-4, $\phi$X174, FHV, HRV-14, Polio and the like. Preferably, a viral protein such as CPMV or CCMV may be used. According to the method of this embodiment, formation of nanoparticles are rendered in compliance with the shape and size of the cavity part of the protein used. Nanoparticle herein refers to a particle having a major axis of 50 nm or less, and having the size at least allowing for stable presence as a particle. An exemplary nanoparticle corresponds to a particle having a major axis of 1 nm to 50 nm.

Moreover, although the production of a nanoparticle composed of a nickel compound is explained in this embodiment, the method of this embodiment can be applied to also in the case where a nanoparticle composed of a compound including a metal atom such as chromium or copper is produced. Metal compounds which may constitute the nanoparticle formed by the method of this embodiment vary depending on the added metal ion or the like, however, they may be for example, a hydroxide and/or an oxide.

When nanoparticles composed of a chromium compound are produced, a chromium salt solution is mixed in the reaction solution instead of the nickel salt solution used in this embodiment. Other conditions are as set forth in this embodiment. When nanoparticles composed of a copper compound are produced, a copper salt solution is mixed in the reaction solution instead of the nickel salt solution used in this embodiment. Other conditions are as set forth in this embodiment.

The presence of a hydrogen carbonate ion ($HCO^{3-}$) and/or carbonate ion ($CO_3^{2-}$) in the reaction solution is important for the formation of a nanoparticle in this embodiment. Therefore, bubbling of carbon dioxide in degassed Milli Q water is executed in the step St2 in this embodiment, however, this step is not limited thereto but a process in which a hydrogen carbonate ion ($HCO^{3-}$) and/or carbonate ion ($CO_3^{2-}$) is added to the reaction solution may be employed. For example, a carbonate such as sodium carbonate ($Na_2CO_3$) or sodium bicarbonate ($NaHCO_3$) or the like may be used through dissolving in Milli Q water.

In accordance with this embodiment, the buffer for use is a mixed solution of HEPES and CAPSO. However, means for adjusting the pH is not limited thereto, but any means may be employed. For example, a buffer containing one kind of a buffering agent may be used, or a mixed solution of multiple kinds of buffering agents may be also used as a buffer. In particular, using a mixed solution of multiple kinds of buffering agents as a buffer is more advantageous than using a buffer containing one kind of a buffering agent, because the pH of the reaction solution can be readily adjusted. Accordingly, it is preferred that a mixed solution of multiple kinds of buffering agents is used as a buffer.

In this embodiment, ammonium nickel sulfate ($NiNH_3(SO_4)$) is used as the nickel salt solution, but not limited thereto. For example, nickel sulfate ($Ni(SO_4)$), nickel nitrate ($Ni(NO_3)_2$) or nickel chloride ($NiCl_2$) may be also used. In this embodiment, it is desired that an ammonium ion ($NH_4^+$) is included in the reaction solution in light of the reaction yield. When an ammonium metal salt solution is used as a metal salt solution, the reaction solution shall contain an ammonium ion without adding any other component to the reaction solution.

In accordance with this embodiment, time period for leaving to stand after preparing the reaction solution is set to be 24 hours, however the time period is not limited thereto, but it is desirable to select the most appropriate time period to comply with the constitution, pH and the like of each reaction solution.

More specific conditions and the like of the reaction solution in connection with the method for the production of a nanoparticle demonstrated in this embodiment are described below in the section of Examples.

Embodiment 2

In this embodiment, a nonvolatile memory cell is explained, which includes dot bodies composed of nanoparticles produced by utilizing nickel compound-apoferritin complexes produced in the embodiment 1 described above, as a floating gate.

Figure 3:
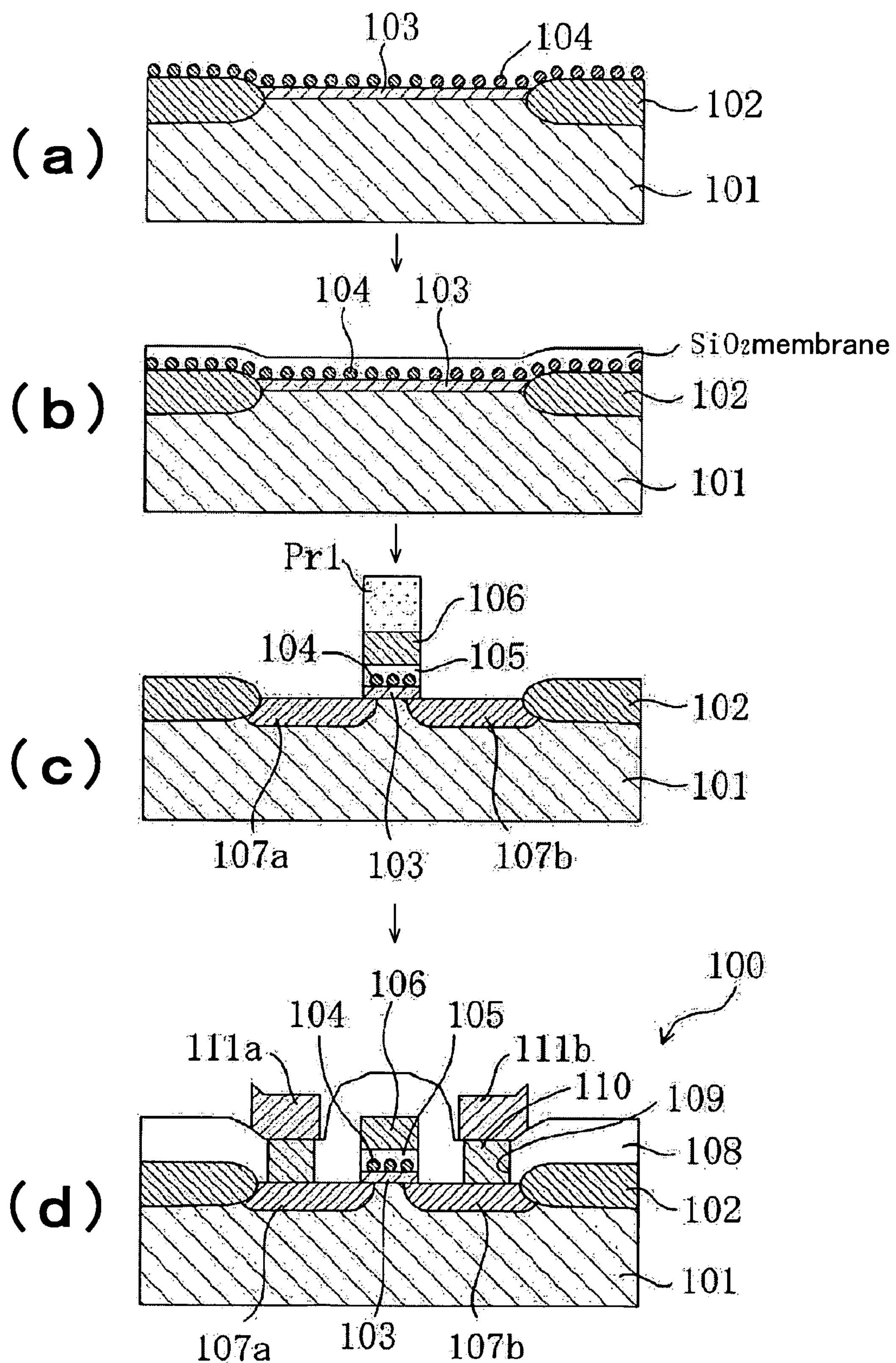
FIGS. 3A–3D are process sectional views illustrating a method of the production of a nonvolatile memory cell.

FIGS. 3(*a*) to (*d*) are process sectional views illustrating a method of the production of a nonvolatile memory cell of this embodiment.

First, in the step depicted in FIG. 3(*a*), on a type p Si basal plate 101 is formed a chip separating oxide membrane 102 surrounding the active region by a LOCOS method, and thereafter a gate oxide membrane 103 which functions as a tunnel insulation membrane is formed on the basal plate by a thermal oxidation method. Then, dot bodies 104 composed of a nanoparticle of nickel having the diameter of approximately 6 nm are formed on the basal plate. Process for forming the dot bodies 104 on the basal plate is explained later.

Next, in the step depicted in FIG. 3(*b*), on the basal plate is deposited a $SiO_2$ membrane into which the dot bodies 104 are embedded by a sputter method or a CVD method.

Next, in the step depicted in FIG. 3(*c*), an Al membrane is deposited on the basal plate. Subsequently, a silicon oxide membrane 105 which shall be an insulation membrane between electrodes and an Al electrode 106 which shall be a regulation gate electrode are formed by patterning of the $SiO_2$ membrane and Al membrane using a photo resist mask Pr1. Upon this manipulation, a part of the gate oxide membrane 103 without being covered by the photo resist mask Pr1 is eliminated, therefore, the dot bodies 104 thereon are concurrently eliminated. Thereafter, first and second diffusion layers 107*a* and 107*b* of type n are formed through carrying out the infusion of an impure ion, with the photo resist mask and the Al electrode 106 as masks.

Then, in the step depicted in FIG. 3(*d*), formation of an insulation membrane 108 between layers; opening of a contact hole 109 of the insulation membrane 108 between layers; formation of a tungsten plug 110 by embedding tungsten into a contact hole 109; and formation of first and second aluminum wirings 111*a* and 111*b* are carried out by any known method.

Although an Si basal plate of type p was used as a basal plate in this embodiment, also an Si basal plate of type n may be used, or alternatively, any basal plate which is constituted from other semiconductor such as a compound semiconductor including GaAs may be also used.

Next, a process for forming dot bodies 104 on the basal plate in the step depicted in FIG. 3(*a*) is explained below with reference to FIG. 4 and FIG. 5. However, the process for forming dot bodies 104 on the basal plate is not limited to the process as explained below, but any other known process can be also applied. First, in the step depicted in FIG. 4(*a*), nickel compound-apoferritin complexes (hereinafter, abbreviated as "complex" in this embodiment) 150 obtained in the aforementioned embodiment 1 are provided, and these complexes 150 are arranged on the surface of a basal plate 130. Accordingly, a complex membrane having the complexes 150 arranged on the surface of the basal plate 130 at high density and with high accuracy is formed. The basal plate 130 herein refers to that formed on an Si basal plate 101 of type p in the step depicted in FIG. 3(*a*) by a LOCOS method through forming a chip separating oxide membrane 102 surrounding the active region, and thereafter forming a gate oxide membrane 103 which functions as a tunnel insulation membrane on the basal plate by a thermal oxidation method. Similar matter can be applied in the following explanation.

Figure 4:
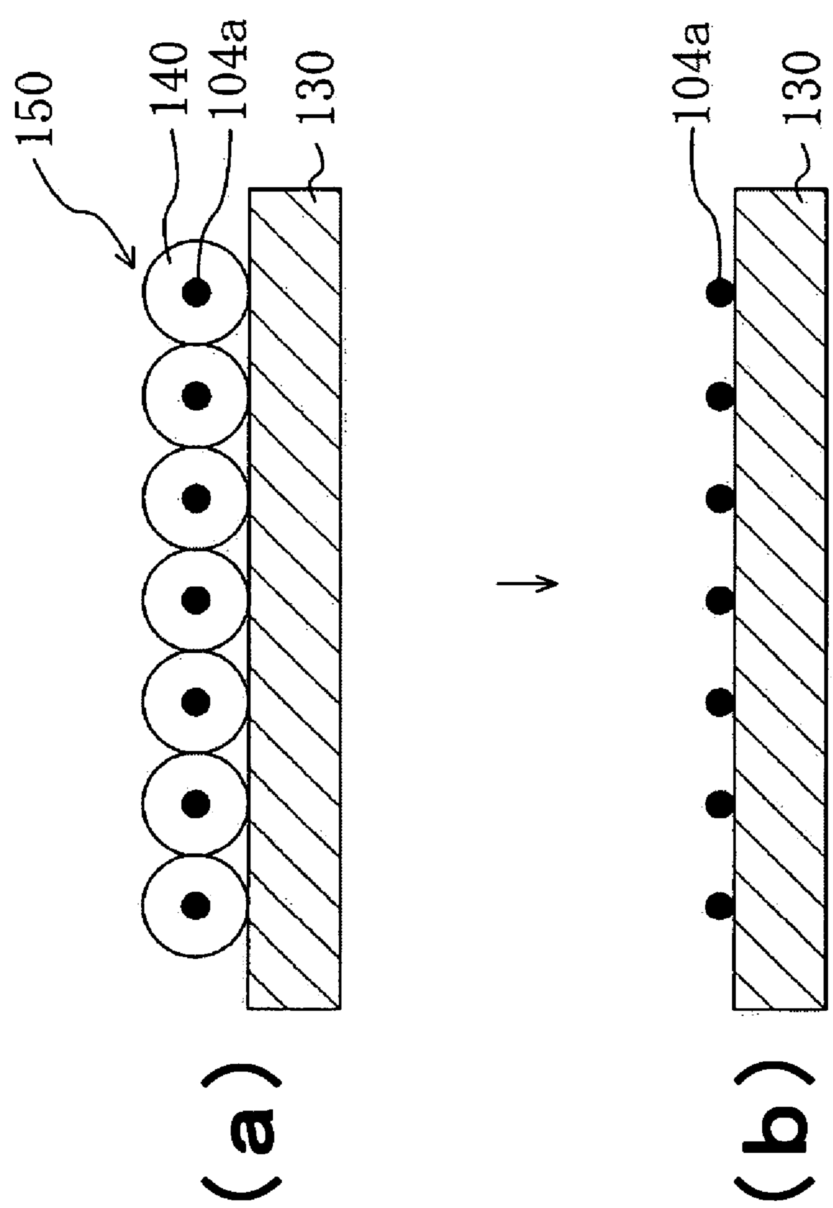
FIGS. 4A and 4B are process sectional views illustrating a method of arranging and fixing dot bodies on the surface of a basal plate in a two dimensional fashion.

Next, in the step depicted in FIG. 4(*b*), dot bodies 104 are formed on the basal plate 130 by eliminating the protein molecules 140 in the complexes 150 to leave the nanoparticles 104*a* of the nickel compounds alone.

In the step depicted in FIG. 4(*a*), the process for arranging the complexes 150 on the surface of the basal plate 130 at high density and with high accuracy, in other words, for aligning and fixing in a two dimensional fashion on the surface of the basal plate 130 is now explained. In this embodiment, a process described in JP-A No. 11-45990 is adopted. The process is explained below with reference to FIG. 5.

Figure 5:
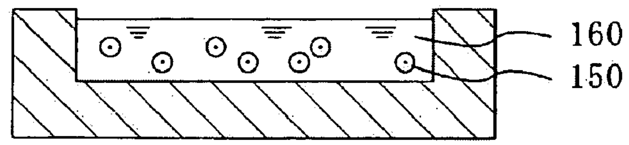
FIGS. 5A–5E are explanatory views illustrating a method of arranging and fixing complexes on the surface of a basal plate in a two dimensional fashion.
Figure 5:
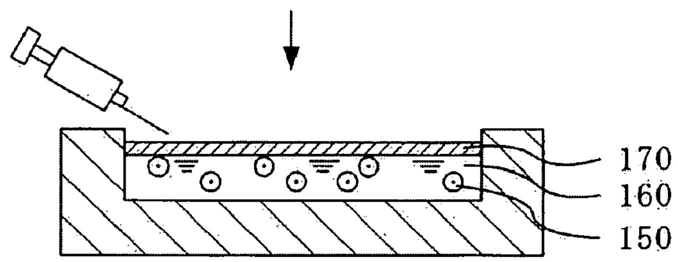
Figure 5:
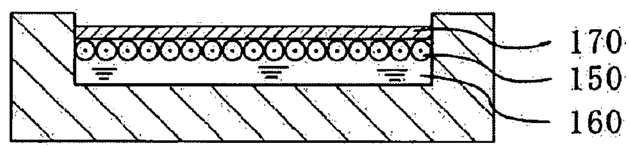
Figure 5:
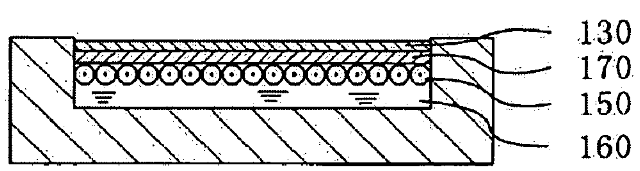
Figure 5:
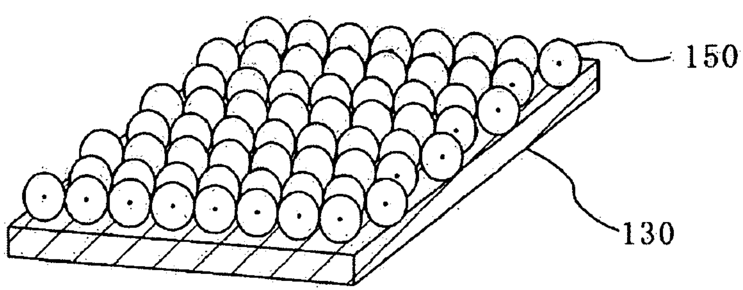

First, in the step depicted in FIG. 5(*a*), a liquid 160 (the nickel compound-apoferritin complexes dispersed in a mixed solution of an equal amount of a phosphate buffer solution having the concentration of 40 mM and pH of 5.3 and an aqueous sodium chloride solution having the concentration of 40 mM) including complexes 150 dispersed therein is provided.

Subsequently, in the step depicted in FIG. 5(*b*), PBLH (Poly-1-Benzil-L-Histidine) is gently developed on the surface of the liquid 160 with a syringe or the like. A polypeptide membrane 170 which is composed of PBLH is thereby formed on the surface of the liquid 160. Thereafter, the pH of the liquid 160 is adjusted.

Next, in the step depicted in FIG. 5(*c*), the complexes 150 are adhered onto the polypeptide membrane 170 in a time dependent manner to yield two dimensional crystals of the complexes 150. This is caused by the positively charged polypeptide membrane 170, contrary to the negatively charged complexes 150.

Next, in the step depicted in FIG. 5(*d*), the basal plate 130 is placed (floated) on the polypeptide membrane 170 to allow adhesion of the polypeptide membrane 170 onto the basal plate 130.

Next, by recovering the basal plate 130 in the step depicted in FIG. 5(*e*), the basal plate 130 having two dimensional crystals of the complexes 150 adhered via the polypeptide membrane 170 can be obtained.

Next, the step depicted in FIG. 4(*b*) is explained in more detail. Since a protein molecule is generally weak against heat, elimination of the protein molecule 140 in the complex 150 is carried out by a heat treatment. For example, by standing still in an inert gas such as nitrogen or the like at 400–500° C. for about 1 hour, the protein molecule 140 and the polypeptide membrane 170 are burnt out, and thus nickel nanoparticles 104*a* remain on the basal plate 130 in a two dimensional fashion as dot bodies 104 which are regularly aligned at high density and with high accuracy.

Accordingly, the dot bodies 104 which are aligned at high density and with high accuracy can be formed by rendering the nickel nanoparticles 104*a* that were held by the complexes 150 appear on the basal plate 130 in a two dimensional fashion, as shown in FIG. 4(*b*). Heat treatment was employed as the process for eliminating the protein molecules 140 in this embodiment, however, the process is not limited thereto but may be executed by deleting through the decomposition of the protein using for example, a proteolytic enzyme, a chemical substance or the like.

As shown in FIG. 3(*d*), the memory cell 100 of this embodiment is equipped with the Al electrode 106 which functions as a regulation gate and a MOS transistor (memory cell transistor) composed of the first and second diffusion layers 107*a* and 107*b* of type n which function as a source or a drain, and is a nonvolatile memory cell in which alteration of threshold potential of the aforementioned memory transistor is utilized depending upon the amount of the charge accumulated in the dot bodies 104 which function as a floating gate.

A function as a memory which memorizes two values can be achieved according to this nonvolatile memory cell. In addition, nickel, chromium and copper are different in terms of their work functions from iron, manganese, cobalt and the like, as shown in Table 1. The work functions presented in Table 1 are cited from H. B. Michaelson "Work Functions of the elements" Journal of Applied Physics, pp. 536–540, volume 21, 1950.

TABLE 1

| Metal | Work function |
|---|---|
| Mn | 4.08 |
| Zn | 4.33 |
| Fe | 4.60 |
| Co | 4.97 |
| Ni | 5.22 |
| Pt | 5.63 |
| Cr | 4.50 |
| Cu | 4.50 |

Consequently, control of the accumulation of electrons is enabled by utilizing these nanoparticles in combination through the use of differences in likelihood of accumulation of the electrons therein. Therefore, versatility of design of the quantum effect device can be achieved.

Figure 6:
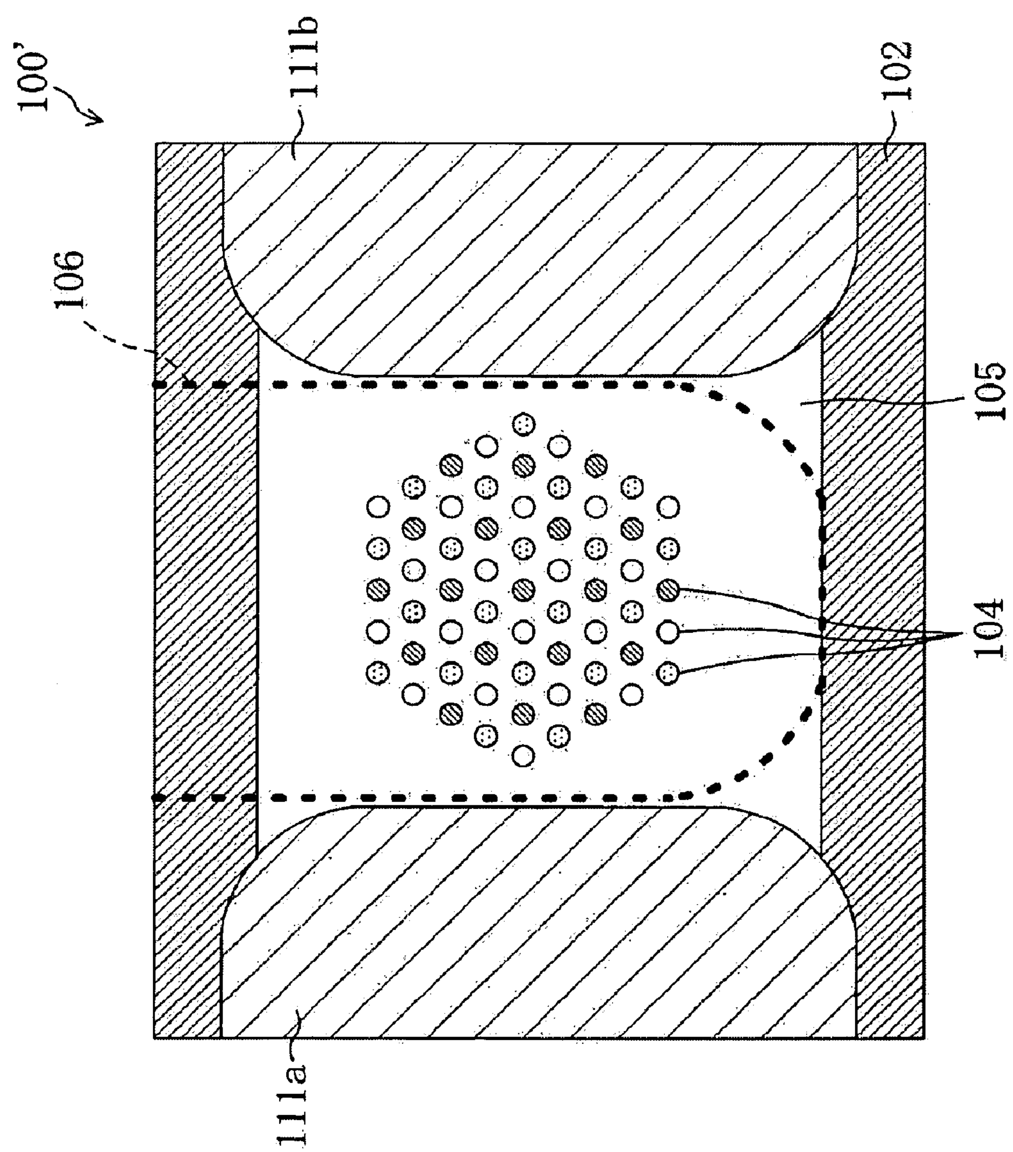
FIG. 6 is a top view illustrating a nonvolatile memory cell.

FIG. 6 is a top view illustrating a nonvolatile memory cell 100' having exactly the same constitution as that of the aforementioned memory cell 100 except that multiple kinds of dot bodies 104, which are formed from compounds having different work functions with each other, are formed as a floating gate.

As is shown in FIG. 6, by forming multiple kinds of dot bodies 104, which are formed from compounds having different work functions with each other, as a floating gate, memory of multiple values that are three values or more (four values memory in the nonvolatile memory cell 100') can be also put into practice capable of controlling not only the presence of the charge accumulated in the dot bodies 104 but also the amount of accumulation of the charge.

Upon clearing data, an FN (Fowler-Nordheim) current via an oxide membrane or a direct tunneling current is utilized.

Further, for writing data, an FN current via the oxide membrane, a direct tunneling current or channel hot electron (CHE) infusion is employed.

Since the nonvolatile memory cell of this embodiment is composed of nickel nanoparticles having the particle diameter small enough to allow the floating gate to function as a quantum dot, the amount of the accumulation of charge becomes slight. Therefore, the amount of current upon writing and clearing can be diminished, and thus a nonvolatile memory cell with low electric power consumption can be constituted.

Additionally, according to the nonvolatile memory cell of this embodiment, because the size of the nickel dot bodies 104 that constitute the floating gate is uniform, properties exhibited during infusion and drawing of the charge are uniform among respective nickel dot bodies 104, and thus regulation upon these manipulations can be readily conducted.

EXAMPLE

Example 1

Production of Nickel Compound-Apoferritin Complex

In this Example, each of the solutions was first prepared, i.e., an apoferritin solution in which HEPES buffer, CAPSO buffer and commercially available apoferritin (derived from equine spleen) were dissolved, and an ammonium nickel sulfate solution. Concentration and pH of each solution are as shown in Table 2. After preparing each solution, degassing of the HEPES buffer and CAPSO buffer was immediately conducted.

TABLE 2

| Solution (pH) | Concentration |
|---|---|
| HEPES buffer (pH 7.5) | 500 mM |
| CAPSO buffer (pH 9.5) | 500 mM |
| Apoferritin solution | 55 mg/ml |
| Ammonium nickel sulfate solution | 200 mM |

Next, Milli Q water was provided, and carbon dioxide-bubbled water was prepared by bubbling carbon dioxide into Milli Q water for 30 minutes. Immediately thereafter, a reaction solution was prepared having the constitution presented in Table 3 by admixing each solution presented in Table 2 into the carbon dioxide-bubbled water. In this Example, reaction solutions having three different CAPSO concentrations were prepared. Thus, reaction solutions having three kinds of pH were prepared.

TABLE 3

| Solution (pH) | Concentration |
|---|---|
| HEPES | 150 mM |
| CAPSO | 235, 250, 265 mM |
| Apoferritin | 0.3 mg/ml |
| Ammonium nickel sulfate | 5 mM |

In this Example, each reaction solution having the constitution presented in Table 3 was prepared to give the total volume of 3 ml, therefore, the amount added of carbon dioxide-bubbled water and each solution presented in Table 2 was as shown in Table 4.

TABLE 4

| Solution (concentration, pH) | Concentration |
|---|---|
| Carbon dioxide-bubbled water | Added to give total volume of 3 ml |
| HEPES buffer (500 mM, pH 7.5) | 900 μl |
| CAPSO buffer (500 mM, pH 9.5) | 1410, 1500, 1590 μl |
| Apoferritin solution (55 mg/ml) | 16.35 μl |
| Ammonium nickel sulfate solution | 75 μl |

Each of the three kinds of reaction solutions obtained as described above was left to stand at 23° C. for 24 hours. Thereafter, each reaction solution was centrifuged at 8000 G for 30 minutes. Each supernatant was collected, and the state of the supernatant was observed.

Next, each of thus resulting supernatants was diluted to three fold with water, stained apoferritin with 2% gold glucose, and observed with a transmission electron microscope (TEM) with fifty thousand fold magnification. When staining is conducted with 2% gold glucose, entry into the holding part in apoferritin does not take place. Therefore, apoferritin having a void holding part, and a nickel compound-apoferritin complex can be discriminated.

Observation of each supernatant with a transmission electron microscope revealed a large number of apoferritin including a nanoparticle of a nickel compound therein, with the appearance of a protein portion having a white colored doughnut like shape, with a central portion which appears black. Nanoparticles of the nickel compound had a spherical shape, with the diameter of 6 nm (standard deviation: 1 nm) In other words, it is deemed that nanoparticles having a uniform particle diameter could be obtained.

The results of observation as described above are presented in Table 5 as a relationship between the concentration of the CAPSO buffer and the yield of nanoparticle formation (hereinafter, may be also referred to as YCF). The yield of nanoparticle formation (YCF) is a ratio of apoferritin including the nanoparticle of the nickel compound (i.e., nickel compound-apoferritin complex) therein among apoferritin in the supernatant.

TABLE 5

| | CAPSO concentration | | |
|---|---|---|---|
| | 235 mM | 250 mM | 265 mM |
| pH | 8.2 | 8.3 | 8.4 |
| Yield of nanoparticle formation | 90% | 100% | 100% |

On the other hand, results obtained by cases in which conditions employed were exactly the same except that nitrogen bubbled water and oxygen bubbled water were used instead of the aforementioned carbon dioxide-bubbled water are shown in Table 6 and Table 7, respectively. Table 6 presents the results when nitrogen bubbled water was used, whilst Table 7 presents the results obtained when oxygen bubbled water was used.

TABLE 6

| | CAPSO concentration | | |
|---|---|---|---|
| | 235 mM | 250 mM | 265 mM |
| pH | 8.2 | 8.3 | 8.4 |
| Yield of nanoparticle formation | 0% | 5% | 20% |

TABLE 7

| | CAPSO concentration | | |
|---|---|---|---|
| | 235 mM | 250 mM | 265 mM |
| pH | 8.1 | 8.2 | 8.3 |
| Yield of nanoparticle formation | 0% | 5% | 20% |

When the states of these supernatants were observed, the supernatant of the reaction solution including CAPSO at the concentration of 250 mM was turbid, and plenty of precipitations of $Ni(OH)_2$ were found in the supernatant of the reaction solution including CAPSO at the concentration of 265 mM. Therefore, it is believed that the precipitation point of Ni $(OH)_2$ in the constitution of the reaction solution of this Example is approximately pH 8.3 (approximately pH 8.2 when oxygen bubbled water was used). At the higher pH than the precipitation point, nickel ions ($Ni^{2+}$) rapidly precipitates in the form of $Ni(OH)_2$, thus, it is believed that a lot of apoferritin aggregates to give precipitates accompanied by such precipitation of $Ni(OH)_2$. On the other hand, it is believed that formation of nanoparticles becomes difficult as the pH becomes lower, because the presence of enough hydroxide ion to form nanoparticles is not ensured in the solution. Therefore, it is concluded that preferable condition for efficiently forming nanoparticles involves the pH which is approximate to the precipitation point or the pH which is slightly lower than the precipitation point.

From the results shown in Tables 5 to 7, it is believed that a nanoparticle is formed in the holding part of apoferritin when the pH approximates to the precipitation point in a solution containing apoferritin because a condition which allows for the formation of a compound from a nickel ion is provided. However, it is in fact exceptionally difficult to form a nanoparticle without causing aggregation and precipitation of apoferritin.

In this Example, in any of the cases where carbon dioxide-bubbled water, nitrogen bubbled water and oxygen bubbled water were used, the aggregation and precipitation of apoferritin was found in the supernatant of the reaction solution, which contains CAPSO at the concentration of 265 mM, having the pH higher than the precipitation point. Accordingly, it is believed that recovery of the nickel compound-apoferritin complex is difficult, and thus industrial utilization thereof is not realistic.

However, as shown in Tables 5 to 7, in the supernatant of the reaction solution including CAPSO at the concentration of 265 mM, nanoparticles were formed in the holding part of approximately 100% of apoferritin only in instances where carbon dioxide-bubbled water was used.

Moreover, when carbon dioxide-bubbled water was used, nanoparticles of the nickel compound were formed in the holding part of most apoferritin at the pH which is slightly lower than the precipitation point (in the supernatant of the reaction solution including CAPSO at the concentration of 235 mM and 250 mM), and the aggregation and precipitation of apoferritin was also suppressed.

To the contrary, in instances where nitrogen bubbled water and oxygen bubbled water were used, nanoparticles were not formed in the holding part of most apoferritin at the pH which is approximate to the precipitation point or is slightly lower than the precipitation point (in the supernatant of the reaction solution including CAPSO at the concentration of 235 mM and 250 mM).

That is, formation of nanoparticles in the holding part of apoferritin while suppressing the aggregation of aggregation could be achieved only in instances where carbon dioxide-bubbled water was used.

Example 2

Test for Examining Influences of Kinds of Anion of Nickel Salt Upon Production of Nickel Compound-Apoferritin Complex In this Example, each of the solutions was first prepared, i.e., anapoferritin solution in which HEPES buffer, CAPSO buffer and commercially available apoferritin (derived from equine spleen) were dissolved, and nickel salt solutions (nickel sulfate solution, nickel nitrate solution and nickel chloride solution). Concentration and pH of each solution are as shown in Table 8. After preparing each solution, degassing of the HEPES buffer and CAPSO buffer was immediately conducted.

TABLE 8

| Solution (pH) | Concentration |
|---|---|
| HEPES buffer (pH 7.5) | 500 mM |
| CAPSO buffer (pH 9.5) | 500 mM |
| Apoferritin solution | 55 mg/ml |
| Nickel salt solution | 200 mM |

Next, Milli Q water was provided, and carbon dioxide-bubbled water was prepared by bubbling carbon dioxide into Milli Q water for 30 minutes. Immediately thereafter, a reaction solution was prepared having the constitution presented in Table 9 by admixing each solution presented in Table 8 into the carbon dioxide-bubbled water. In this Example, reaction solutions having three different CAPSO concentrations were prepared. Thus, reaction solutions having three kinds of pH were prepared.

TABLE 9

| Solution (pH) | Concentration |
|---|---|
| HEPES | 150 mM |
| CAPSO | 140, 150, 160 mM |
| Apoferritin | 0.3 mg/ml |
| Ammonium nickel sulfate | 5 mM |

In this Example, each reaction solution having the constitution presented in Table 9 was prepared to give the total volume of 3 ml, therefore, the amount added of carbon dioxide-bubbled water and each solution presented in Table 8 was as shown in Table 10.

TABLE 10

| Solution (concentration, pH) | Concentration |
|---|---|
| Carbon dioxide-bubbled water | Added to give total volume of 3 ml |
| HEPES buffer (500 mM, pH 7.5) | 900 μl |
| CAPSO buffer (500 mM, pH 9.5) | 840, 900, 960 μl |
| Apoferritin solution (55 mg/ml) | 16.35 μl |
| Nickel salt solution (200 mM) | 75 μl |

Each of the three kinds of reaction solutions obtained as described above was left to stand at 23° C. for 24 hours. Thereafter, each reaction solution was centrifuged at 8000 G for 30 minutes. Each supernatant was collected, and the state of the supernatant was observed. Each supernatant of the reaction solution including CAPSO at the concentration of 160 mM (pH 8.24) was slightly turbid, thus it was believed that the precipitation point of $Ni(OH)_2$ in the constitution of the reaction solution of this Example was approximately pH 8.2.

Next, each of thus resulting supernatants was diluted to three fold with water, stained apoferritin with 2% gold glucose, and observed with a transmission electron microscope (TEM) with fifty thousand fold magnification. When staining is conducted with 2% gold glucose, entry into the holding part in apoferritin does not take place. Therefore, apoferritin having a void holding part, and a nickel compound-apoferritin complex can be discriminated.

Figure 7A:
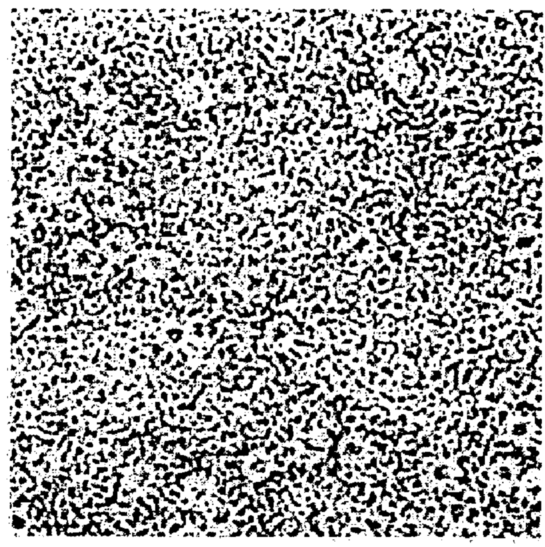
FIGS. 7A, B and C show electron micrographs illustrating states of the formation of the nanoparticles in Example 2.
Figure 7B:
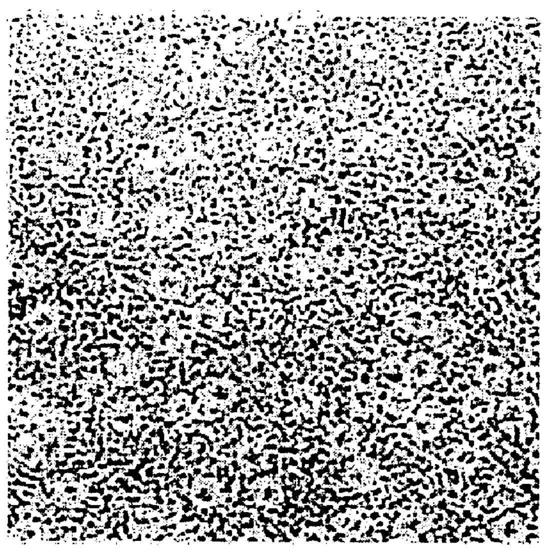
Figure 7C:
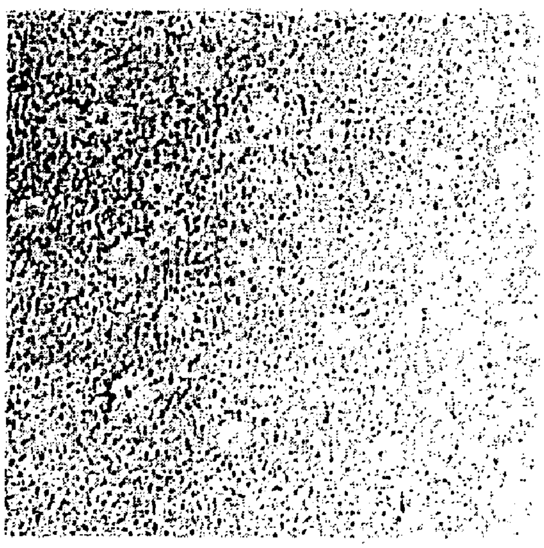

Results of observation of each supernatant with a transmission electron microscope are illustrated in FIGS. 7A to C. As is shown in FIGS. 7A to C, apoferritin including a nanoparticle of a nickel compound therein, with the appearance of a protein portion having a white colored doughnut like shape, with a central portion which appears black, was observed. In any of the supernatants, nanoparticles of the nickel compound had a spherical shape, with the diameter of 6 nm (standard deviation: 1 nm). In other words, it is deemed that nanoparticles having a uniform particle diameter could be obtained.

The results of observation as described above are presented in Table 11 as a relationship between the concentration of CAPSO and the yield of nanoparticle formation (YCF) versus each nickel salt used.

TABLE 11

| CAPSO | Yield of nanoparticle formation (%) | | |
|---|---|---|---|
| concentration | Nickel sulfate | Nickel nitrate | Nickel chloride |
| 140 mM (pH8.14) | 40–50 | 30–40 | 50–60 |
| 160 mM (pH 8.19) | 100 | 100 | 100 |
| 180 mM (pH 8.24) | 100 | 100 | 100 |

As is clear from Table 11, nanoparticles of a nickel compound were formed in the holding part of almost 100% apoferritin at the pH of approximately 8.2 which is a precipitation point of $Ni(OH)_2$ in the constitution of the reaction solution of this Example. Furthermore, also in each supernatant of the reaction solution including CAPSO at the concentration of 140 mM (pH 8.14), it is revealed that nanoparticles of a nickel compound were formed in the holding part of apoferritin, although the yield of nanoparticle formation was low.

From the results of this Example and the results of the aforementioned Example 1, it is concluded that the pH which is approximate to or is slightly lower than the precipitation point of $Ni(OH)_2$ is suitable for efficiently forming nanoparticles of a nickel compound in the holding part of apoferritin.

Moreover, from the results of this Example, the yield of nanoparticle formation was approximately the same irrespective of kinds of anion of the nickel salt. Therefore, it is revealed that anion of the nickel salt does not affect the formation of nanoparticles.

Example 3

Test for Exploring Optimal Conditions: pH; Concentration of Ammonium Nickel Sulfate Solution; and Time Period for Leaving to Stand, Upon Production of Nickel Compound-Apoferritin Complex In this Example, each of the solutions was first prepared, i.e., anapoferritin solution in which HEPES buffer, CAPSO buffer and commercially available apoferritin (derived from equine spleen) were dissolved, and an ammonium nickel sulfate solution. Concentration and pH of each solution are as shown in Table 12. After preparing each solution, degassing of the HEPES buffer and CAPSO buffer was immediately conducted.

TABLE 12

| Solution (pH) | Concentration |
|---|---|
| HEPES buffer (pH 7.5) | 500 mM |
| CAPSO buffer (pH 9.5) | 500 mM |
| Apoferritin solution | 55 mg/ml |
| Ammonium nickel sulfate solution | 200 mM |

Next, Milli Q water was provided, and carbon dioxide-bubbled water was prepared by bubbling carbon dioxide into Milli Q water for 30 minutes. Immediately thereafter, twelve kinds of reaction solutions having the constitutions 1 to 12 presented in Table 13 were prepared by admixing each solution described above into the carbon dioxide-bubbled water such that the total volume became 3 ml.

TABLE 13

| | HEPES (mM) | CAPSO (mM) | Apoferritin (mg/ml) | Ammonium nickel sulfate (mM) |
|---|---|---|---|---|
| Constitution 1 | 150 | 220 | 0.3 | 2 |
| Constitution 2 | 150 | 240 | 0.3 | 2 |
| Constitution 3 | 150 | 260 | 0.3 | 2 |
| Constitution 4 | 150 | 220 | 0.3 | 3 |
| Constitution 5 | 150 | 240 | 0.3 | 3 |
| Constitution 6 | 150 | 260 | 0.3 | 3 |
| Constitution 7 | 150 | 220 | 0.3 | 5 |
| Constitution 8 | 150 | 240 | 0.3 | 5 |
| Constitution 9 | 150 | 260 | 0.3 | 5 |
| Constitution 10 | 150 | 220 | 0.3 | 10 |
| Constitution 11 | 150 | 240 | 0.3 | 10 |
| Constitution 12 | 150 | 260 | 0.3 | 10 |

Each of the solutions having twelve kinds of constitutions obtained as described above was left to stand at 23° C. for 0, 8, 16, 24, 32, 40 and 48 hours. The pH of each solution is as shown in Table 14, and the pH was not altered after leaving to stand for 48 hours.

TABLE 14

| | pH of solution |
|---|---|
| Constitution 1 | 8.74 |
| Constitution 2 | 8.82 |
| Constitution 3 | 8.93 |
| Constitution 4 | 8.48 |
| Constitution 5 | 8.58 |
| Constitution 6 | 8.73 |
| Constitution 7 | 8.32 |
| Constitution 8 | 8.42 |
| Constitution 9 | 8.5 |
| Constitution 10 | 8.14 |
| Constitution 11 | 8.15 |
| Constitution 12 | 8.16 |

After leaving to stand for a predetermined time period, each reaction solution was centrifuged at 8000 G for 10 minutes. Each supernatant was collected, and the state of the supernatant was observed.

First, the concentration of apoferritin in the resulting supernatant was determined using a protein assay kit (manufactured by BioRad).

Next, the resulting each supernatant was diluted to 3 fold with water, stained apoferritin with 2% gold glucose, and observed with a transmission electron microscope (TEM) with fifty thousand fold magnification. When staining is conducted with 2% gold glucose, entry into the holding part in apoferritin does not take place. Therefore, apoferritin having a void holding part, and a nickel compound-apoferritin complex can be discriminated. A nickel compound-apoferritin complex presented the appearance of a protein portion having a white colored doughnut like shape, with a central portion including a nanoparticle of a nickel compound which appears black.

Figure 8A:
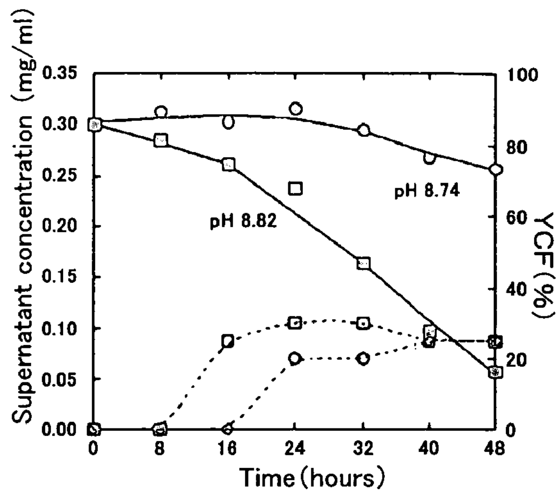
FIGS. 8A, B, C and D are views illustrating the relationship between time at each concentration of ammonium nickel sulfate, and apoferritin concentration and the yield of formation in Example 3.
Figure 8B:
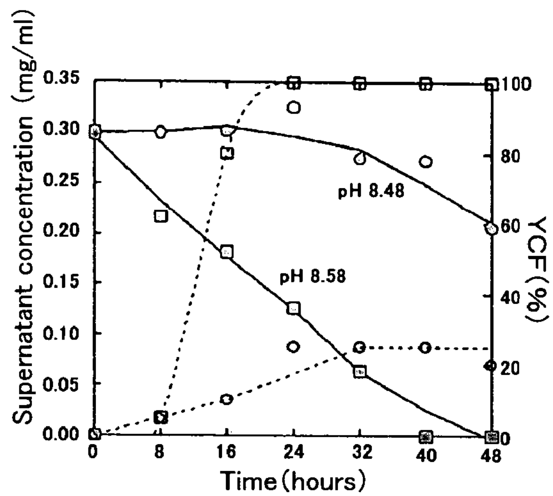
Figure 8C:
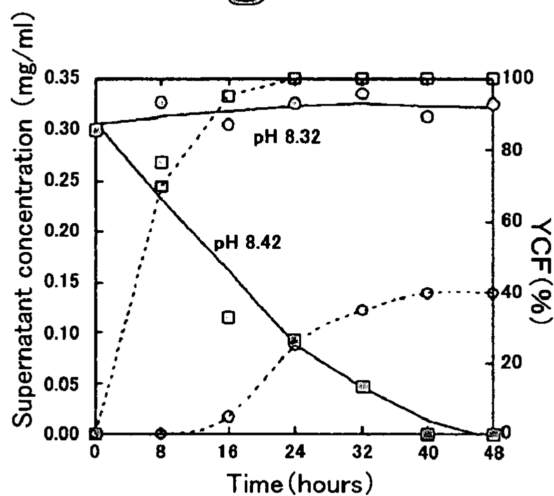
Figure 8D:
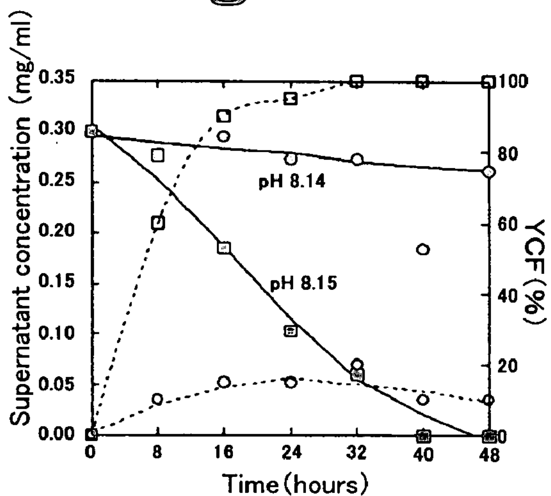

The results of observation above are illustrated in FIGS. 8A to D as a relationship between the time period for leaving to stand and the concentration of apoferritin (solid curve), and as a relationship between the time period for leaving to stand and the yield of nanoparticle formation (YCF) (dashed curve). FIGS. 8A, B, C and D illustrate the cases in which the concentration of ammonium nickel sulfate is 2, 3, 5 and 10 mM, respectively. Any of the solutions including CAPSO at the concentration of 260 mM (compositions 3, 6, 9 and 12) resulted in precipitation of almost all apoferritin after leaving to stand for 8 hours, with the concentration of apoferritin in the supernatant of approximately 0. Therefore, the results obtained thereby are omitted in FIGS. 8A, B, C and D. Thus, the results illustrated in FIG. 8 are: A for samples 1 and 2; B for samples 4 and 5; C for samples 7 and 8; D for samples 10 and 11.

As is clear from the results as described above, precipitation points of $Ni(OH)_2$ in the cases where the concentration of ammonium nickel sulfate is 2, 3, 5 and 10 mM, respectively, were approximately 8.82, 8.58, 8.42 and 8.15.

Next, the results of observation described above are illustrated in FIG. 9 as a relationship between the concentration of ammonium nickel sulfate and the efficiency of nanoparticle formation (ECF) (solid curve), and as a relationship between the concentration of ammonium nickel sulfate and the pH of precipitation point (dashed curve). The efficiency of nanoparticle formation (ECF) is a ratio of apoferritin including the nanoparticle therein (i.e., nickel compound-apoferritin complex) in the supernatant among apoferritin which was added initially (when the solution was prepared).

Figure 9:
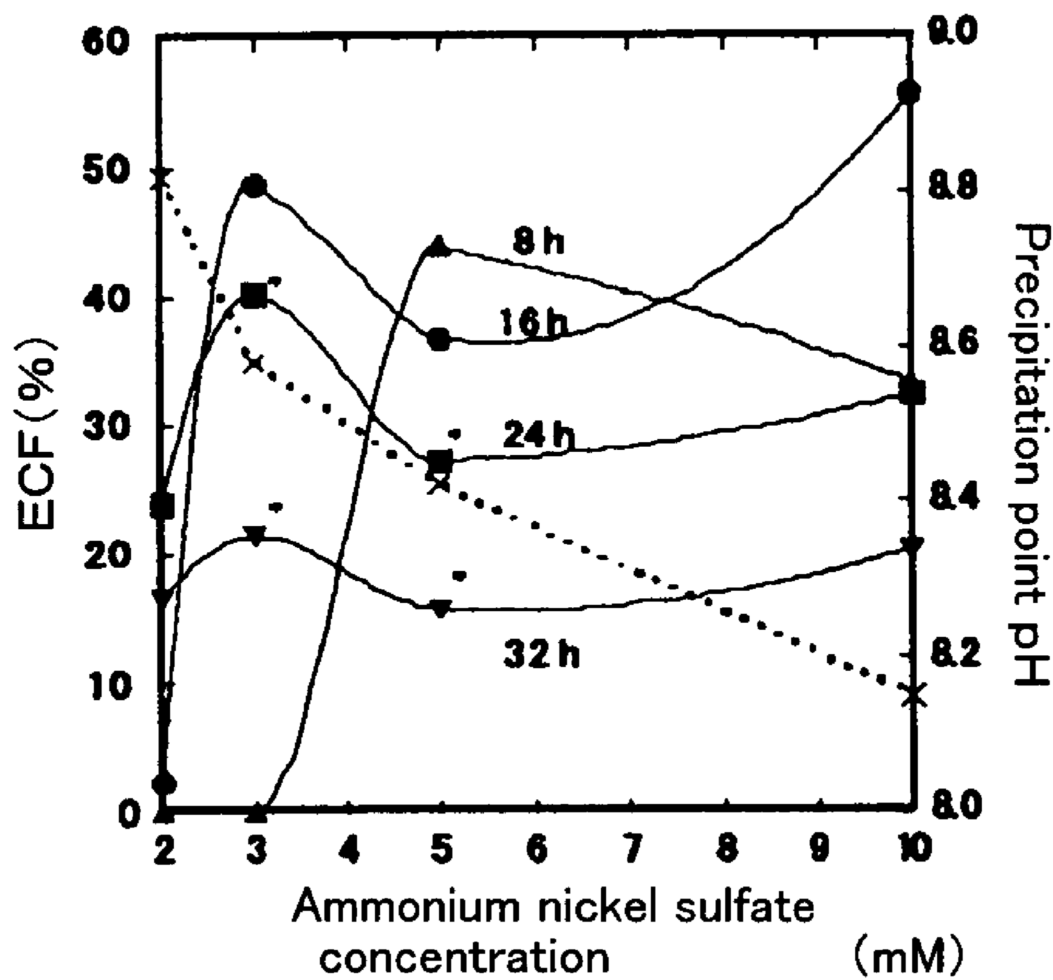
FIG. 9 is a view illustrating the relationship between the concentration of ammonium nickel sulfate and efficiency of formation in Example 3.

From the results illustrated in FIG. 9, the efficiency of nanoparticle formation (ECF) exhibits a maximum value at the concentration of approximately 3 mM of ammonium nickel sulfate when the solution was left to stand for 16 hours or longer. Although the highest efficiency of nanoparticle formation (ECF) is exhibited when the solution was left to stand for 16 hours, the yield of nanoparticle formation (YCF) under this condition is not 100% at any concentration of ammonium nickel sulfate, as is clear from FIGS. 8A, B, C and D. When the yield of nanoparticle formation (YCF) is not 100%, it turns out that apoferritin which includes a nanoparticle and apoferritin which does not include apoferritin coexist, therefore, a further purification step for separating these is required. Accordingly, it is believed that a condition of: the concentration of ammonium nickel sulfate of 3 mM; pH of approximately 8.58; and time period for leaving to stand the solution post preparation of 24 hours may be an optimal condition for producing a nickel compound-apoferritin complex, in light of the efficiency of formation and the efficiency of purification.

Example 4

Test for Examining Influences of Ammonium Ion Upon Production of Nickel Compound-Apoferritin Complex In this Example, each of the solutions was first prepared, i.e., anapoferritin solution in which HEPES buffer, CAPSO buffer and commercially available apoferritin were dissolved, and an ammonium nickel sulfate solution. Concentration and pH of each solution are as shown in Table 15. After preparing each solution, degassing of the HEPES buffer and CAPSO buffer was immediately conducted.

TABLE 15

| Solution (pH) | Concentration |
|---|---|
| HEPES buffer (pH 7.5) | 500 mM |
| CAPSO buffer (pH 9.5) | 500 mM |
| Apoferritin solution | 55 mg/ml |

TABLE 15-continued

| Solution (pH) | Concentration |
|---|---|
| Aqueous ammonia | 1000 mM |
| Nickel salt solution | 200 mM |

Next, Milli Q water was provided, and carbon dioxide-bubbled water was prepared by bubbling carbon dioxide into Milli Q water for 30 minutes. Immediately thereafter, a reaction solution was prepared by admixing each solution presented in Table 15 into the carbon dioxide-bubbled water. In addition, a reaction solution was also prepared at the same time to which water which was subjected to merely degassing without bubbling carbon dioxide (degassed water) was added in stead of the carbon dioxide-bubbled water. The constitution of the reaction solution is presented in Table 16.

TABLE 16

| Solution (pH) | Concentration |
|---|---|
| HEPES | 150 mM |
| CAPSO | 210 mM |
| Apoferritin | 0.3 mg/ml |
| $NH^{4+}$ (supplied from aqueous ammonia) | 20 mM |
| Ammonium nickel sulfate solution | 5 mM |

In this Example, each reaction solution having the constitution presented in Table 16 was prepared to give the total volume of 3 ml, therefore, the amount added of each solution presented in Table 15 and carbon dioxide-bubbled water or degassed water was as shown in Table 17.

TABLE 17

| Solution (pH) | Concentration |
|---|---|
| Carbon dioxide-bubbled water or degassed water | Added to give total volume of 3 ml |
| HEPES buffer (500 mM, pH 7.5) | 900 μl |
| CAPSO buffer (500 mM, pH 9.5) | 1260 μl |
| Apoferritin solution (55 mg/ml) | 16.35 μl |
| Aqueous ammonia | 60 μl |
| Ammonium nickel sulfate solution (200 mM) | 75 μl |

Each of thus resulting solutions was left to stand at 23° C. for 24 hours. Thereafter, each reaction solution was centrifuged at 8000 G for 30 minutes. Each supernatant was collected, and the state of the supernatant was observed.

Next, each of thus resulting supernatants was diluted to three fold with water, stained apoferritin with 2% gold glucose, and observed with a transmission electron microscope (TEM) with fifty thousand fold magnification. When staining is conducted with 2% gold glucose, entry into the holding part in apoferritin does not take place. Therefore, apoferritin having a void holding part, and a nickel compound-apoferritin complex can be discriminated.

Figure 10A:
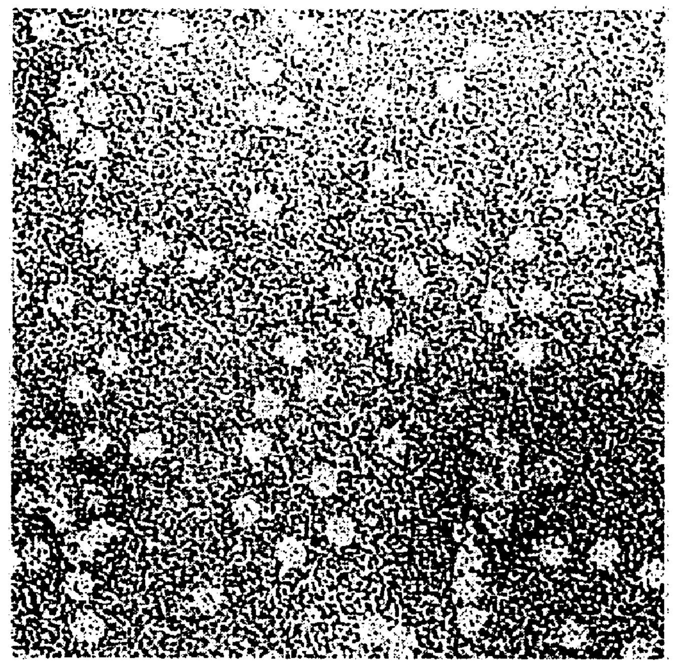
FIGS. 10A and B show electron micrographs illustrating states of the formation of the nanoparticles in Example 4.

Result of observation with a transmission electron microscope of the supernatant of the reaction solution in which carbon dioxide-bubbled water was used is illustrated in FIG. 10A. As is shown in FIG. 10A, apoferritin including a nanoparticle of a nickel compound therein, with the appearance of a protein portion having a white colored doughnut like shape with a central portion which appears black, was observed.

The pH of the supernatant of the reaction solution in which carbon dioxide-bubbled water was used was further adjusted, and explored for the precipitation point. Consequently, the precipitation point of $Ni(OH)_2$ was pH of 8.65. Grounds for elevation of the pH of the precipitation point compared to the aforementioned Examples 1 to 3 are believed to involve protection of a nickel ion ($Ni^{2+}$) through the formation of a complex between the ammonium ion and the nickel ion ($Ni^{2+}$). Range of pH, from the pH of 8.65 of this precipitation point to the pH which is slightly lower than this pH of 8.65, is an optimal range of pH for forming a nanoparticle of the nickel compound. It could be ascertained that aggregation of apoferritin was suppressed, and that a nanoparticle of the nickel compound was formed in the holding part of apoferritin, when the supernatant of the reaction solution in which carbon dioxide-bubbled water was used fell within the aforementioned optimal range of pH.

When the pH of the supernatant of the reaction solution in which carbon dioxide-bubbled water is used rises higher than the pH of 8.65 of the precipitation point, apoferritin aggregates, and thus industrial utilization becomes difficult. Further, as the pH of the supernatant of the reaction solution in which carbon dioxide-bubbled water is used lowers than the optimal range of pH for forming a nanoparticle, formation of nanoparticles declines, with no formation of nanoparticles observed at pH of 8.3.

Figure 10B:
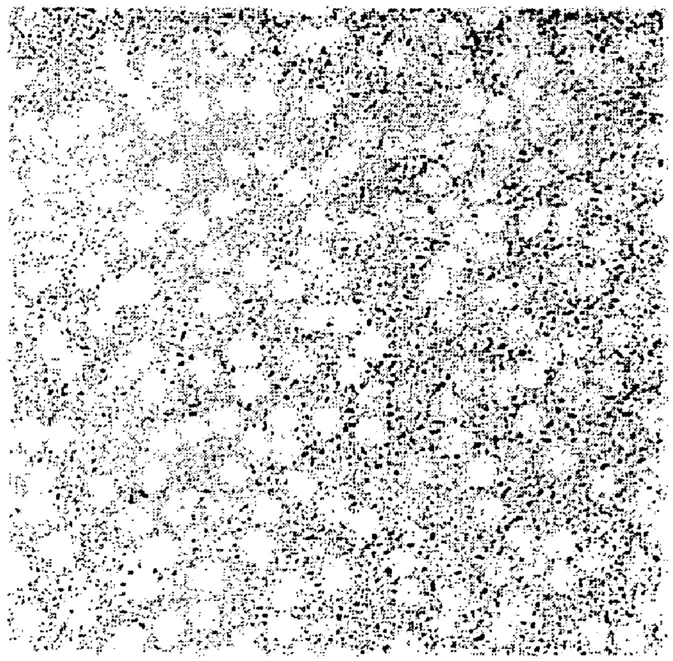

On the other hand, a result of observation with a transmission electron microscope of the supernatant of the reaction solution in which degassed water was used is illustrated in FIG. 10B. As is shown in FIG. 10B, apoferritin including a nanoparticle of a nickel compound therein, with the appearance of a protein portion having a white colored doughnut like shape with a central portion which appears black, was not observed. Additionally, similar results were obtained even though the pH of the supernatant of the reaction solution in which degassed water was used was variously altered. Although causes of failure of formation of a nanoparticle are believed to involve influences of the ammonium ion, the mechanism thereof is uncertain.

In any event, because the ammonium ion which is present in the reaction solution forms a complex with the nickel ion ($Ni^{2+}$) to result in stabilization, the pH of the precipitation point of $Ni(OH)_2$ becomes high in this Example. Importance of the presence of a carbonate ion and/or a hydrogen carbonate ion in the reaction solution for the formation of a nanoparticle, and suitability for forming the nanoparticle of keeping the pH of the reaction solution to be slightly lower than the pH of the precipitation point of $Ni(OH)_2$ are commonly found as in the aforementioned Examples 1 to 3.

Example 5

Test for Exploring Optimal Concentration of Ammonium Ion Upon Production of Nickel Compound-Apoferritin Complex In this Example, each of the solutions was first prepared, i.e., anapoferritin solution in which HEPES buffer, CAPSO buffer and commercially available apoferritin (derived from equine spleen) were dissolved, and an ammonium nickel sulfate solution. Concentration and pH of each solution are as shown in Table 18. After preparing each solution, degassing of the HEPES buffer and CAPSO buffer was immediately conducted.

TABLE 18

| Solution (pH) | Concentration |
|---|---|
| HEPES buffer (pH 7.5) | 500 mM |
| CAPSO buffer (pH 9.5) | 500 mM |
| Apoferritin solution | 55 mg/ml |
| Aqueous ammonia | 1000 mM |
| Ammonium nickel salt solution | 200 mM |

Next, Milli Q water was provided, and carbon dioxide-bubbled water was prepared by bubbling carbon dioxide into Milli Q water for 30 minutes. Immediately thereafter, each solution as shown in Table 18 was admixed into carbon dioxide-bubbled water to give the reaction solution having the constitution presented in Table 19 with the total volume of 3 ml.

TABLE 19

| Solution (pH) | Concentration |
|---|---|
| HEPES | 150 mM |
| CAPSO | 150 to 300 mM |
| Apoferritin | 0.3 mg/ml |
| $NH^{4+}$ (supplied from aqueous ammonia) | 0, 10, 20, 30 mM |
| Ammonium nickel sulfate solution | 5 mM |

Each of the reaction solutions obtained as described above was left to stand at 23° C. for 48 hours. Thereafter, each reaction solution was centrifuged at 8000 G for 30 minutes. Each supernatant was collected, and the state of the supernatant was observed.

Next, each of thus resulting supernatants was diluted to three fold with water, stained apoferritin with 2% gold glucose, and observed with a transmission electron microscope (TEM) with fifty thousand fold magnification. When staining is conducted with 2% gold glucose, entry into the holding part in apoferritin does not take place. Therefore, apoferritin having a void holding part, and a nickel compound-apoferritin complex can be discriminated.

Figure 11A:
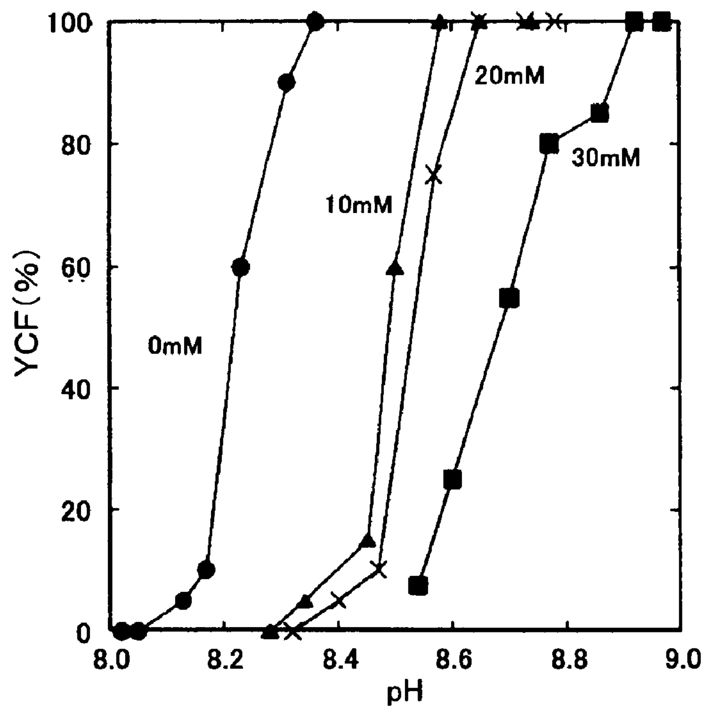
FIG. 11A is a view illustrating the relationship between pH and yield of formation.
Figure 11B:
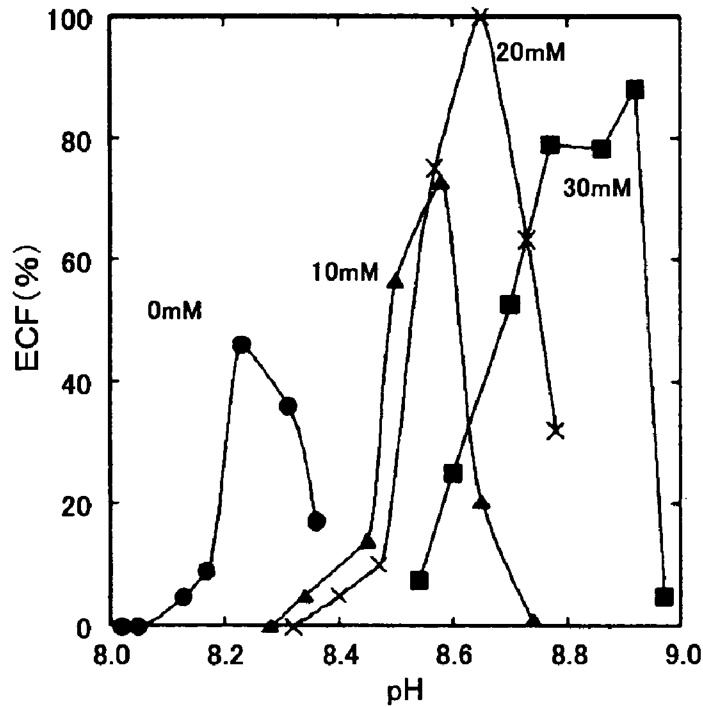
FIG. 11B is a view illustrating the relationship between pH and efficiency of formation in Example 5.

Results of the above observation are illustrated in FIG. 11A for yield of nanoparticle formation (YCF), and in FIG. 11B for efficiency of nanoparticle formation (ECF) versus pH of the supernatant of the reaction solution. The precipitation point of each solution was: pH of 8.42 for the solution to which aqueous ammonia was not added, pH of 8.58 at 10 mM of the ammonium ion (hereinafter, the ammonium ion in this Example refers to one supplied from aqueous ammonia), pH of 8.65 at 20 mM of the ammonium ion, and pH of approximately 8.92 at 30 mM of the ammonium ion.

As is clear from the aforementioned results, the pH of the precipitation point increases depending on the concentration of the ammonium ion as added. Grounds for this event are believed to involve protection of a nickel ion ($Ni^{2+}$) through the formation of a complex between the ammonium ion and the nickel ion ($Ni^{2+}$) as is also analyzed in Example 4. Range of pH, from the pH which is approximate to the pH of this precipitation point or slightly lower than this precipitation point is optimal for forming nanoparticles in each of the solutions including an ammonium ion at different concentrations. It could be ascertained that aggregation of apoferritin was suppressed, and a nanoparticle of the nickel compound was formed in the holding part of apoferritin when the supernatant of the reaction solution in which carbon dioxide-bubbled water was used fell within the aforementioned optimal range of pH.

As is clear from FIG. 11B, the highest efficiency of nanoparticle formation (ECF) was exhibited by a solution including the aqueous ammonia at the concentration of 20 mM, being 100% at the pH which is approximate to the precipitation point. Having the efficiency of nanoparticle formation (ECF) of 100% means that all apoferritin added to the solution forms a nanoparticle in its holding part. In Example 3 without the addition of aqueous ammonia, the efficiency of nanoparticle formation (ECF) did not reach to 100% under any condition (see, FIG. 9), therefore, it is revealed that efficient formation of nanoparticles was enabled by adding an ammonium ion. In particular, in the constitution of this Example, the best yield of the nanoparticles is achieved when an ammonium ion is added such that the concentration becomes 20 mM. Irrespective of the addition of aqueous ammonia, the yield of nanoparticle formation (YCF) attained 100% at the pH which is approximate to the precipitation point, respectively.

In this Example, high value of efficiency of nanoparticle formation (ECF) is obtained by adding an ammonium ion at an appropriate concentration. In addition, importance of the presence of a carbonate ion and/or a hydrogen carbonate ion in the reaction solution for the formation of a nanoparticle, and suitability for forming the nanoparticle of keeping the pH of the reaction solution to be approximate to the pH of the precipitation point of $Ni(OH)_2$ or slightly lower than the same are commonly found as in the aforementioned Examples 1 to 4.

Example 6

Production of Chromium Compound-Apoferritin Complex

In this Example, each of the solutions was first prepared, i.e., an L chain apoferritin solution in which HEPES buffer, MES buffer and genetically engineered apoferritin of L chain alone were dissolved, and an ammonium chromium sulfate solution. Concentration and pH of each solution are as shown in Table 20. After preparing each solution, degassing of the HEPES buffer and MES buffer was immediately conducted.

TABLE 20

| Solution (pH) | Concentration |
|---|---|
| HEPES buffer (pH 7.5) | 500 mM |
| MES buffer (pH 5.5) | 55 mM |
| L chain apoferritin solution | 55 mg/ml |
| Ammonium chromium sulfate solution | 200 mM |

Next, Milli Q water was provided, and carbon dioxide-bubbled water was prepared by bubbling carbon dioxide into Milli Q water for 30 minutes. Immediately thereafter, a reaction solution was prepared having the constitution presented in Table 21 by admixing each solution presented in Table 20 into the carbon dioxide-bubbled water.

TABLE 21

| Solution (pH) | Concentration |
|---|---|
| HEPES | 150 mM |
| MES | 210 mM |
| L chain apoferritin | 0.1 mg/ml |
| Ammonium chromium sulfate | 5 mM |

In this Example, each reaction solution having the constitution presented in Table 21 was prepared to give the total volume of 3 ml, therefore, the amount added of carbon dioxide-bubbled water and each solution presented in Table 20 was as shown in Table 22.

TABLE 22

| Solution (concentration, pH) | Concentration |
|---|---|
| Carbon dioxide-bubbled water | Added to give total volume of 3 ml |
| HEPES buffer (500 mM, pH 7.5) | 900 μl |
| MES buffer (500 mM, pH 5.5) | 1260 μl |
| L chain apoferritin solution (27.5 mg/ml) | 16.35 μl |
| Ammonium chromium sulfate solution (200 mM) | 75 μl |

The reaction solutions obtained as described above were left to stand at 23° C. for 24 hours. Thereafter, each reaction solution was centrifuged at 8000 G for 30 minutes. Each supernatant was collected, and the state of the supernatant was observed.

Next, each of thus resulting supernatants was diluted to three fold with water, stained apoferritin with 2% gold glucose, and observed with a transmission electron microscope (TEM) with fifty thousand fold magnification. When staining is conducted with 2% gold glucose, entry into the holding part in apoferritin does not take place. Therefore, apoferritin having a void holding part, and apoferritin including the nanoparticle of the chromium compound (i.e., chromium compound-apoferritin complex) therein can be discriminated.

Observation of each supernatant with a transmission electron microscope revealed a large number of apoferritin including a nanoparticle of a chromium compound therein, with the appearance of a protein portion having a white colored doughnut like shape, with a central portion which appears black. Nanoparticles of the chromium compound had a spherical shape, with the diameter of 6 nm (standard deviation: 1 nm). In other words, it is deemed that nanoparticles having a uniform particle diameter could be obtained.

Because the pH of the reaction solution was adjusted to be approximate to the precipitation point of $Cr(OH)_2$, the supernatant of the reaction solution was slightly turbid. When the supernatant was observed with a transmission electron microscope, apoferritin including a nanoparticle of a chromium compound therein, with the appearance of a protein portion having a white colored doughnut like shape, with a central portion which appears black was observed.

Under the condition employed in this Example, nanoparticles of the chromium compound were ascertained within about 50% of apoferritin in the supernatant. In other words, the yield of nanoparticle formation (YCF) was about 50%. Although production of nanoparticles of the chromium compound was attempted with the reaction solution under the same condition except that degassed water was used in stead of carbon dioxide-bubbled water, formation of nanoparticles of the chromium compound was not ascertained.

Example 7

Production of Copper Compound-Apoferritin Complex

In this Example, each of the solutions was first prepared, i.e., an apoferritin solution in which MES buffer, and commercially available apoferritin (derived from equine spleen) were dissolved, and an ammonium copper sulfate solution. Concentration and pH of each solution are as shown in Table 23. After preparing each solution, degassing of the MES buffer was immediately conducted.

TABLE 23

| Solution (pH) | Concentration |
|---|---|
| MES buffer (pH 6.0) | 500 mM |
| Apoferritin solution | 5 mg/ml |
| Ammonium copper sulfate solution | 10 mM |

Next, Milli Q water was provided, and carbon dioxide-bubbled water was prepared by bubbling carbon dioxide into Milli Q water for 30 minutes. Immediately thereafter, a reaction solution was prepared having the constitution presented in Table 24 by admixing each solution presented in Table 23 into the carbon dioxide-bubbled water.

TABLE 24

| Solution (pH) | Concentration |
|---|---|
| MES | 100 mM |
| Apoferritin | 0.15 mg/ml |
| Ammonium copper sulfate | 1.2 mM |

In this Example, each reaction solution having the constitution presented in Table 23 was prepared to give the total volume of 3 ml, therefore, the amount added of carbon dioxide-bubbled water and each solution presented in Table 23 was as shown in Table 25.

TABLE 25

| Solution (concentration, pH) | Concentration |
|---|---|
| Carbon dioxide-bubbled water | Added to give total volume of 3 ml |
| MES buffer (500 mM, pH 6.0) | 600 μl |
| Apoferritin solution (5 mg/ml) | 90 μl |
| Ammonium copper sulfate solution (10 mM) | 360 μl |

The reaction solutions obtained as described above were left to stand at 23° C. for 24 hours. Thereafter, each reaction solution was centrifuged at 8000 G for 30 minutes. Each supernatant was collected, and the state of the supernatant was observed.

Next, each of thus resulting supernatants was diluted to three fold with water, stained apoferritin with 2% gold glucose, and observed with a transmission electron microscope (TEM) with fifty thousand fold magnification. When staining is conducted with 2% gold glucose, entry into the holding part in apoferritin does not take place. Therefore, apoferritin having a void holding part, and apoferritin including the nanoparticle of the copper compound (i.e., copper compound-apoferritin complex) therein can be discriminated.

Observation of each supernatant with a transmission electron microscope revealed a large number of apoferritin including a nanoparticle of a copper compound therein, with the appearance of a protein portion having a white colored doughnut like shape, with a central portion which appears black. Nanoparticles of the copper compound ($Cu(OH)_2$) had a spherical shape, with the diameter of 6 nm (standard deviation: 1 nm). In other words, it is deemed that nanoparticles having a uniform particle diameter could be obtained.

Because the pH of the reaction solution was adjusted to be approximate to the precipitation point of the copper compound ($Cu(OH)_2$), the supernatant of the reaction solution was slightly turbid. When the supernatant was observed with a transmission electron microscope, apoferritin including a nanoparticle of a copper compound therein, with the appearance of a protein portion having a white colored doughnut like shape, with a central portion which appears black was observed.

Under the condition employed in this Example, nanoparticles of the copper compound were ascertained within about 30 to 40% of apoferritin in the supernatant. In other words, the yield of nanoparticle formation (YCF) was about 30 to 40%.

As explained hereinabove, nanoparticles having a uniform particle diameter can be obtained according to the present invention. Moreover, according to the present invention, to obtain a compound particle is enabled in a cavity part of a protein also with a metal ion which had not been hitherto reported on the formation of a particle in the cavity part of a protein, and in addition, nanoparticles having a uniform particle diameter composed of such a metal ion can be obtained.

According to the present invention, nanoparticles having a uniform particle diameter can be provided. Nanoparticles which are provided by the present invention can be utilized for semiconductor chips, single-gun devices, quantum dots, light emitting elements and the like through utilizing the quantum effects of the same.

Furthermore, the nanoparticles provided by the present invention can be utilized as a material with a sophisticated function, high performance, high density and high precision, such as e.g., optical function coating materials, electromagnetic wave shielding materials, materials for secondary batteries, fluorescent materials, materials for electronic parts, materials for magnetic recording, materials for grinding, materials for cosmetics and the like.

It will be obvious to those having skill in the art that many changes may be made in the above-described details of the preferred embodiments of the present invention. The scope of the present invention, therefore, should be determined by the following claims.

What is claimed is:

1. A method of the production of a nanoparticle which comprises a step of forming a nanoparticle including a hydroxide of a metal ion in a cavity part of apoferritin, by mixing a first solution and a second solution, wherein said first solution contains apoferritin, an alkaline buffer solution, and a metal ion selected from the group consisting of a nickel ion ($Ni^{2+}$), a chromium ion ($Cr^{2+}$) and a copper ion ($Cu^{2+}$), and said second solution contains carbonate ion and/or hydrogen carbonate ion, wherein the pH of the mixed solution is between 8 and 9, inclusive.

2. The method of the production of a nanoparticle according to claim 1, wherein said metal ion is a nickel ion.

3. The method of the production of a nanoparticle according to claim 1, wherein said metal ion is a chromium ion.

4. The method of the production of a nanoparticle according to claim 1, wherein said metal ion is a copper ion.

5. The method of the production of a nanoparticle according to claim 1, wherein pH of a solution after mixing is approximately equal to a precipitation point of a hydroxide of said metal ion.

6. The method of the production of a nanoparticle according to claim 1, wherein a third solution containing an ammonium ion is further mixed at said step.

7. The method of the production of a nanoparticle according to claim 6, wherein pH of said solution after mixing is greater than 8.3 and equal to or less than 8.65.

8. The method of the production of a nanoparticle according to claim 1, further comprising a step of eliminating the apoferritin by a heat treatment after forming said nanoparticle.

9. The method of production of a nanoparticle according to claim 1, wherein said second solution comprises carbonate ion and/or a hydrogen carbonate ion produced by bubbling carbon dioxide thereto.

* * * * *